(12) United States Patent
Nordlinder et al.

(10) Patent No.: US 8,114,267 B2
(45) Date of Patent: Feb. 14, 2012

(54) METHOD OF MONITORING A SUBSTRATE PATTERNING PROCESS

(75) Inventors: Staffan Nordlinder, Norrköping (SE); Nathaniel D. Robinson, Kolmården (SE); Payman Therani, Norrköping (SE)

(73) Assignee: Acreo AB, Kista (SE)

( * ) Notice: Subject to any disclaimer, the term of this patent is extended or adjusted under 35 U.S.C. 154(b) by 1145 days.

(21) Appl. No.: 11/976,633

(22) Filed: Oct. 26, 2007

(65) Prior Publication Data

US 2008/0156663 A1 Jul. 3, 2008

(30) Foreign Application Priority Data

Oct. 27, 2006 (EP) .................................... 06123108

(51) Int. Cl.
*G02F 1/00* (2006.01)
(52) U.S. Cl. ......... 205/688; 205/699; 205/703; 205/766
(58) Field of Classification Search .................. 205/688, 205/699, 703, 766
See application file for complete search history.

(56) References Cited

U.S. PATENT DOCUMENTS

| | | | |
|---|---|---|---|
| 4,566,019 A | 1/1986 | Goldrian et al. | |
| 6,278,075 B1 * | 8/2001 | Kamiguchi et al. | 219/69.12 |
| 6,562,201 B2 | 5/2003 | Dowling | |
| 2002/0160296 A1 | 10/2002 | Wolk et al. | |
| 2004/0028875 A1 | 2/2004 | Van Rijn et al. | |
| 2004/0188656 A1 | 9/2004 | Hennerdal et al. | |
| 2005/0019976 A1 | 1/2005 | Xiao et al. | |
| 2005/0029934 A1 | 2/2005 | Blanchet-Fincher | |
| 2005/0079386 A1 | 4/2005 | Brown, Jr. et al. | |

FOREIGN PATENT DOCUMENTS

WO     WO 98/14825     4/1998

OTHER PUBLICATIONS

Rigoberto C. Advincula: "What's New in the Advincula Research Group", Department of Chemistry, University of Houston, Houston, TX 77204.
European Search Report 06123108.0 completed Mar. 7, 2007.
Office Action for corresponding European patent application No. 07 119 282.7 dated Feb. 16, 2011.

* cited by examiner

*Primary Examiner* — Arun S Phasge
(74) *Attorney, Agent, or Firm* — Harness, Dickey & Pierce, P.L.C.

(57) ABSTRACT

A method for monitoring a substrate patterning process, where at least two electrodes are used to apply a voltage to the substrate to cause a reaction in a portion of the substrate, that includes recording a current driven by said voltage as a function of time and/or as a function of a position of the substrate or a patterning mask. Also disclosed are a device and a computer program product for monitoring the substrate patterning process.

10 Claims, 2 Drawing Sheets

METHOD OF MONITORING A SUBSTRATE PATTERNING PROCESS

PRIORITY STATEMENT

This application claims priority under 35 U.S.C. §119 to European Patent Publication No. 06123108.0, filed on Oct. 27, 2006, the entire contents of which is hereby incorporated herein by reference.

TECHNICAL FIELD

The present disclosure relates to a method for monitoring a substrate patterning process. The disclosure also relates to a device and a computer program product for controlling the electrochemical patterning process.

BACKGROUND

Electrochemical patterning of electrically conducting polymers (PEDOT:PSS) is known and described in e.g. US2004/0188656 A1. In such electrochemical patterning, an electrically conducting polymer is rendered essentially non-conducting through the application of an electrolyte on the polymer, whereby an electric voltage is applied to the polymer using at least two electrodes connected to a voltage supply. Each electrode is in independent contact with one of the polymer and the electrolyte, and in response to the voltage, the polymer is rendered essentially non-conducting in the interface between the polymer and the electrolyte.

US 2004/0188656AI discloses a process for patterning a substrate comprising. a conducting polymer, wherein a predetermined voltage was applied to the conducting polymer, and the resulting current was measured. However, it is not possible based on the disclosure of US 2004/0188656A1 to determine, on a real-time basis, whether the patterning process is operating properly.

U.S. Pat. No. 4,566,019 discloses a method for operating a print electrode in an electroerosion printer. The method comprises applying a trigger pulse having a high maximum voltage and a limited maximum current. However, it is not possible based on the disclosure of U.S. Pat. No. 4,566,019 to determine, on a realtime basis, whether the patterning process is operating properly.

Neither of the above mentioned prior art documents provides any possibility for controlling that the patterning process is proceeding properly, in particularly not during an ongoing production process.

In a production setting, it would be desirable to be able to verify, on a real-time basis, that the patterning process is operating properly. However, as the result of the patterning process, i.e. the non-conducting portions of the polymer, cannot always be immediately recognized, e.g. through visual inspection or in-line testing, there is a need for an improved method of monitoring the printing process.

SUMMARY

It is thus an object of the present disclosure, to provide a method and a device for monitoring an electrochemical patterning process.

One particular object is to provide a method and a device for monitoring an electrochemical patterning process in a reel-to-reel printing application, which is run at high speed.

The invention is defined by the appended independent claims. Embodiments are set forth in the dependent claims, and in the following description and in the appended drawings.

According to a first aspect, there is provided a method for monitoring a substrate patterning process, wherein at least two electrodes are used to apply a voltage to the substrate to cause a reaction in a portion of the substrate. The method comprises recording a current driven by said voltage as a function of time and/or as a function of a position of the substrate or a patterning mask.

Thus, an electronically driven patterning step in a reel-to-reel process, for example electrochemical patterning of PEDOT in a printing press, which is driven by the potential applied between electrodes, can be monitored via the current driven to maintain that potential. The amplitude of the current as a function of time, or equivalently as a function of position within the patterning mask, can be predicted given the charge required to pattern the substrate (per unit area), the speed at which the substrate is driven, and the total linear width of the substrate multiplied by the fraction being patterned at that time.

Process errors that are detectable include, but are not limited to, tool errors (wear, salt or oxide build-up), pattern errors (wear or damage to the pattern) or short circuits. For example, if the patterning is incomplete (insufficient potential has been supplied or not enough electroactive "ink" has been applied, etc.), the trace will either look different (e.g. the peaks may be cut off) or may not have the right amplitude (current is too low). Similarly, should the two rollers 2, 3 between which the potential is applied (as shown in FIG. 1) short circuit, higher than expected current would be measured. In either case, the system can be shut down either automatically or by an operator.

The method provided can be used for real-time analysis of the patterning process as it runs on e.g. a printing machine. This allows the process to be monitored and controlled via e.g. software on a computer provided with a data acquisition system, to ensure that the electrochemical process is occurring as it should in the printing press. In general, the method is applicable for any process that can be monitored electronically in conjunction with the operation of a reel-to-reel process. It can also be used for similar electronic processes such as the plotter pen and mask processes described in US2004/0188656 A1.

The electronic monitoring system disclosed herein allows quality control during printing, such that the process can be stopped (or altered) immediately when a problem occurs.

The method may further comprise comparing the recorded current, or a signal representative thereof, to an estimated current value or to a reference value.

The estimated value may be predetermined (i.e. calculated or measured value), or a reference current.

The method may further comprise providing an output signal based on said comparison.

The output signal may be used to provide a feedback for controlling the substrate patterning process.

The recorded current, or the output signal may be stored in a memory.

In the patterning process, the substrate may comprise an electrically conducting polymer.

The method may further comprise bringing an electrolyte into contact with the substrate, and applying said voltage such that said reaction is an electrochemical reaction in an interface between the electrolyte and the substrate. The patterning process may comprise an electronically driven electrochemical reduction or oxidation reaction.

Alternatively, the reaction may be an evaporation and/or combustion reaction of a portion of the substrate. Such a reaction may be caused by a sufficiently large current being conducted between the electrodes.

The patterning process may comprise transferring a pattern from a patterning roll onto the substrate.

The patterning process may comprise a printing step.

The patterning process may comprise providing the pattern by a plotter, a pen, screen printing, relief printing, planographic printing, lithography, or intaglio printing.

According to a second aspect, there is provided a device for monitoring a substrate patterning process. The device may comprise at least two electrodes arranged to provide a voltage to the substrate to cause a reaction in a portion of the substrate. The device further comprises current measuring means arranged to record a current driven by said voltage.

The device may further comprise an electrolyte applicator arranged to bring an electrolyte into contact with the substrate, wherein the electrodes are arranged for applying said voltage such that said reaction is an electrochemical reaction in an interface between the electrolyte and the substrate.

Alternatively, or as a complement, the electrodes may be arranged to evaporate and/or combust a portion of the substrate.

One of said electrodes may be connected to a patterning device providing substantially a point contact or a line contact with the substrate.

By "substantially" is meant that the point or line contact may, due to e.g. material flexibility or resilience, have some radial or transverse extent, respectively.

Another one of the electrodes may be connected to an anvil device, arranged to support the substrate at or near the patterning device.

The device may further comprise grounding means arranged on at least one of the upstream side and the downstream side of the electrodes.

The device may further comprise a data processing device arranged to receive a signal corresponding to said current.

The data processing device may be arranged to perform at least one of the following actions substantially in real time:

storing said signal in a data memory;

presenting a representation of said signal on a user interface;

sending said signal to a remote unit;

comparing said signal to one or more predetermined values; and providing a control signal for said electrochemical patterning process.

The signal may be provided as a function of time, pixel position, and/or patterning device position.

The user interface may be any graphic user interface, an audible signal (alarm), a tactile display, etc.

The sending may be to e.g. a central monitoring unit, a remote control unit or a remote monitoring unit.

Comparing may be with respect to min/max values or with estimated/calculated reference values as a function of time, pixel position, patterning device position etc.

The control signal may be a stop signal, stopping the process, a regulating signal, controlling process speed, the current supplied, patterning/anvil distance etc.

According to a third aspect, there is provided a computer program product for use in monitoring a substrate patterning process. The computer program product may comprise instructions, which when executed in a processing unit causes the processing unit to receive a first signal representing a current driven by a voltage applied between by at least two electrodes to the substrate, causing a reaction in a surface portion of the substrate.

The computer program product as claimed may further comprise instructions which when executed in the processing unit causes said processing unit to compare the first signal with a second signal representing a reference current, and to output a third signal in response to said comparison.

The monitoring method will now be described in more detail with reference to the appended drawings.

According to another aspect there is provided a method for monitoring a substrate patterning process, wherein at least two electrodes are used to apply a voltage to the substrate to provide a predetermined current causing a reaction in a portion of the substrate. This aspect comprises recording the voltage as a function of time and/or as a function of a position of the substrate or a patterning mask.

DESCRIPTION OF EMBODIMENTS

The patterning process will initially be described with respect to an embodiment of the present disclosure, which comprises bringing an electrically conducting polymer in contact with an electrolyte, and applying an electric voltage in such a way as to cause electrochemical reactions within the area of contact between polymer and electrolyte. This is achieved through the use of at least two electrodes connected to a voltage supply.

Depending on the set-up used, there are alternative ways that the electrodes may supply the voltage needed for the electrochemical reactions: (i) both electrodes are in direct electrical contact with the polymer; (ii) one electrode is in direct electrical contact with the polymer whereas the other is in direct electrical contact with the electrolyte; or (iii) both electrodes are in direct electrical contact with the same electrolyte or different electrolytes. In the case of more than two electrodes, any combination of electrodes contacting the polymer and electrodes contacting electrolytes falls within the scope of the appended claims.

Figure 1:
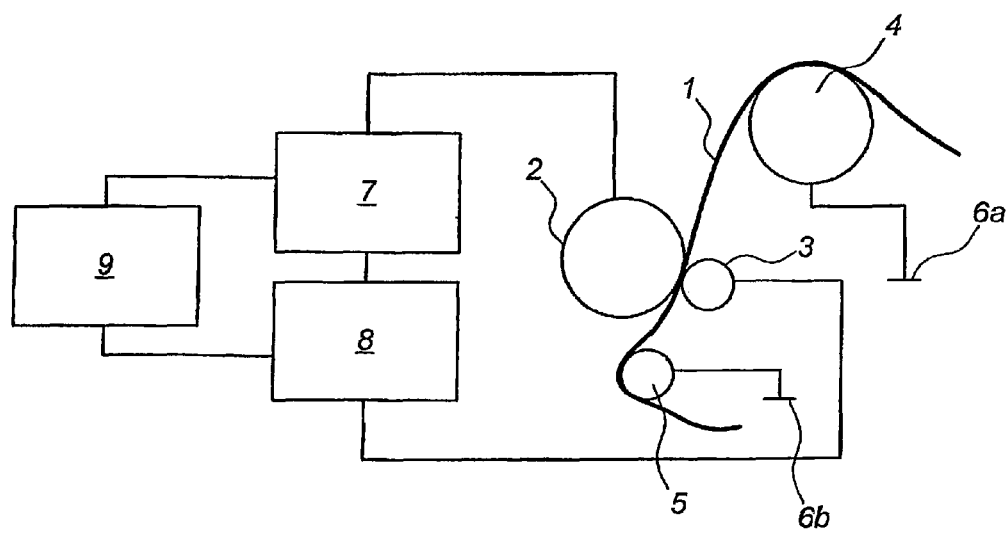
FIG. 1 is a schematic drawing illustrating a reel to reel printing system according to an embodiment.

Referring to FIG. 1, an embodiment based on the roll-to-roll processes described with reference to FIGS. 4-6 of US2004/0188656 A1, will now be described.

A substrate web 1, which may comprise, or consist of, conducting polymer is arranged to travel between a number of rolls 2, 3, 4, 5, as is conventional in printing machines.

In the illustrated example, the web may be squeezed by a patterning roll 2 and an anvil roll 3. The substrate web 1 may further travel between first and second deflection rolls 4, 5.

A current supply 7 may be connected to the patterning roll 2 (or alternatively to the anvil roll 3) and a current meter 8 may be connected to the anvil roll (or alternatively to the patterning roll 2). The current supply 7 and the current meter 8 are also connected to each other. Furthermore, a processing unit 9 may be connected to the current supply 7 to control the current supplied therefrom, and to the current meter 8 to receive a signal representing the current flowing in the circuit comprising the current supply 7, the patterning roll 2, the substrate web 1, the anvil roll 3 and the current meter 8.

The substrate web 1, which in some applications may be electrically conducting, may be grounded on one or both sides of the nip formed by the patterning roll 2 and the anvil roll 3. This grounding may be provided by the first and second deflection rolls 4, 5 being connected to ground, as indicated by reference numerals 6a, 6b. Other means for providing the ground connection may include providing grounding electrodes in contact with the substrate web 1 on both sides of the nip formed by the patterning roll 2 and the anvil roll 3.

The patterning roll 2 may be divided into two or more laterally separated and electrically isolated patterning areas, whereby a respective current passing through each patterning area may be recorded by a separately formed circuit.

The patterning and anvil rolls 2, 3 may be journalled in electrically isolating bearings. Such bearings are known to the skilled person. Also, one or more of the deflection rolls 4, 5 may be journalled in electrically isolating bearings.

When running the printing process, whereby the substrate web 1 passes in contact with the patterning roll 2, and an electrically active "ink" (electrolyte), is provided on the substrate web 1, a current is supplied from the current supply 7 to provide a voltage in an interface surface between the substrate and the electrolyte. The voltage induces an electrochemical reaction (redox reaction) in the interface between the substrate and the electrolyte, whereby the properties of the electrolyte and/or the substrate are altered. One example is the electrical passivation of an otherwise electrically conducting substrate, as described in US2004/0188656 A1.

The current is measured by the current meter 8. The current may either be presented to an operator directly by the current meter 8, or it may be transferred to a processing unit 9 for processing in accordance with what is described below. It is recognized that the current supply 7, the current meter 8 and the processing unit 9 may be provided as separate units, or as an integrated unit. In a particular embodiment, the current supply 7 and the current meter 8 are provided as an integrated unit, whereas the processing unit 9 may be provided in the form of a programmable computer.

The recorded current may be stored in a memory device as a function of time and/or position, and/or it may be used to provide a feedback signal for controlling the patterning process. Such a feedback signal may e.g. adjust the voltage or stop the entire process in the event that a limit current value is reached. Storage may be provided in a predetermined data format, e.g. with a current value associated with each line of contact (FIG. 2) or with each 2D position.

The description will now focus on the operation of the process monitoring system.

Figure 2:
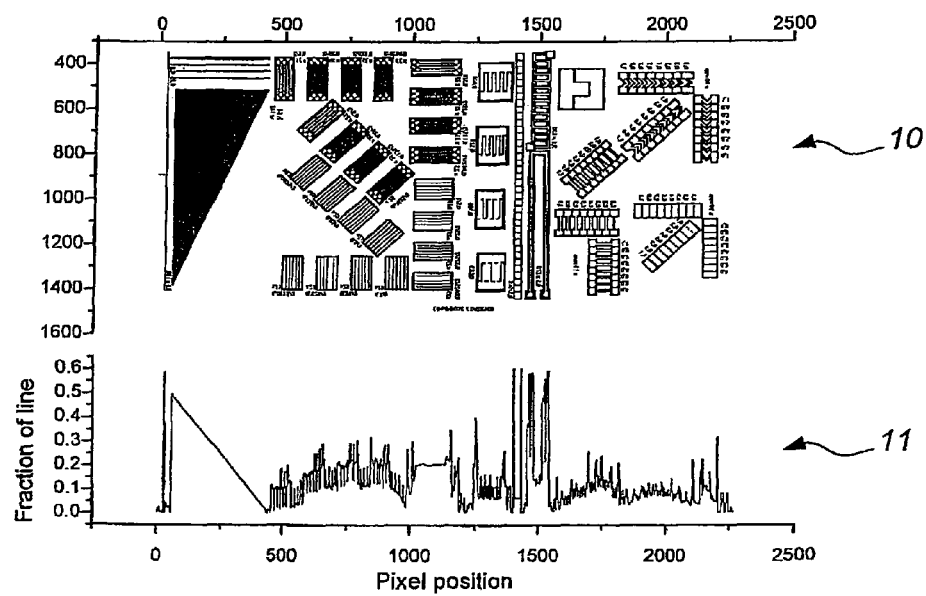
FIG. 2 illustrates a circuit pattern, which may be provided as an envelope on a printing reel, and a corresponding fraction-of-line graph.

The upper part 10 of FIG. 2 illustrates a schematic circuit pattern, which may be provided on the patterning roll 2, whereby the vertical axis in the upper part 10 of FIG. 2 represents a length direction of the patterning roll 2, and consequently a width direction of the substrate web 1, and the horizontal axis represents a circumferential direction of the patterning roll 2, and consequently a length direction of the substrate web 1.

The lower part 11 of FIG. 2 illustrates a schematic fraction of line graph, indicating an extent to which the pattern in the upper part 10 corresponds to a line in the length direction of the patterning roll 2.

Thus, FIG. 2 can be said to illustrate an example of a patterning mask, and since the nip between the patterning roll 2 and the anvil roll 3 can be seen as a line of contact, the fraction of line graph in the lower part 11 of FIG. 2 represents the shape of a cronoamperometric response during a patterning using said patterning mask.

The fraction of line graph indicates a (dimensionless) current versus drum position (time multiplied by velocity). To calculate the actual current (charge/time), the fraction shown may be multiplied by the charge per unit area (charge/length$^2$) required to print/pattern the material, the width of full line (length), and the velocity of the printing process (length/time).

The comparison may be made in a plurality of ways, some of which are outlined below.

In a first embodiment, a reference current trace (curve shape) as a function of pattern position may be provided.

The reference current trace may be calculated or estimated based on the pattern that is to be transferred. Alternatively, or as a complement, the reference current trace may be provided by recording a current trace of a patterning device that is known to function properly. Such recording may, e.g. be done in connection with installation of a new patterning device or in connection with a successful evaluation run of the patterning process.

The measured current trace may then be compared to the reference current trace, either in real time, or at regular intervals, whereby tolerances may be predetermined, both with respect to current amplitude and position.

In a second embodiment, reference and measured current trace curves may be matched, optionally with predetermined tolerances.

In a third embodiment, derivatives (e.g. first and second derivatives) of reference and measured current trace curves may be used, optionally with predetermined tolerances, as a basis for comparison.

In a fourth embodiment, the reference and measured current trace curve may be integrated over position/time, whereby the integrated curves are compared in real time, or at certain intervals.

In a fifth embodiment, an average current value over a part of the circumference of the patterning roll 2 may be used for comparison with a corresponding reference value. Hence, an average value may be calculated over a broad line or a rectangle having a known area.

In all of the above embodiments, it is also possible to use sampled or average values over two or more patterning cycles, e.g. rotations of the patterning roll 2.

As an alternative, or as a complement, it is possible to monitor the measured current trace for certain conditions, such as spikes or other excessive currents, which may indicated short circuiting, which in turn may indicate metal-to-metal contact, e.g. between the rolls 2, 3, or galvanic contact between the rolls and/or the substrate 1, e.g. due to impurities in the electrolyte. Also, a continuous decrease in current over a plurality of cycles may indicate deterioration of the equipment, e.g. due to salt or oxide build-up on the tools.

Applying tolerances, integrating over position/time and averaging are alternative or complementary approaches to handling high speeds and slippage between the rolls 2, 3 and the substrate web 1.

For applications wherein the patterning process as described above generates a somehow visible pattern (i.e. visible by a camera operating at a suitable wavelength), the current metering process monitoring system may be complemented by a camera monitoring system.

For example, a camera directed to the roll or to the substrate may be used to determine an expected current trace, whereby the above indicated methods may be used to compare the expected current value with the measured current value.

Such a camera may be provided in the form of a line sensor, which may be synchronized with the current meter 8.

Figure 3:
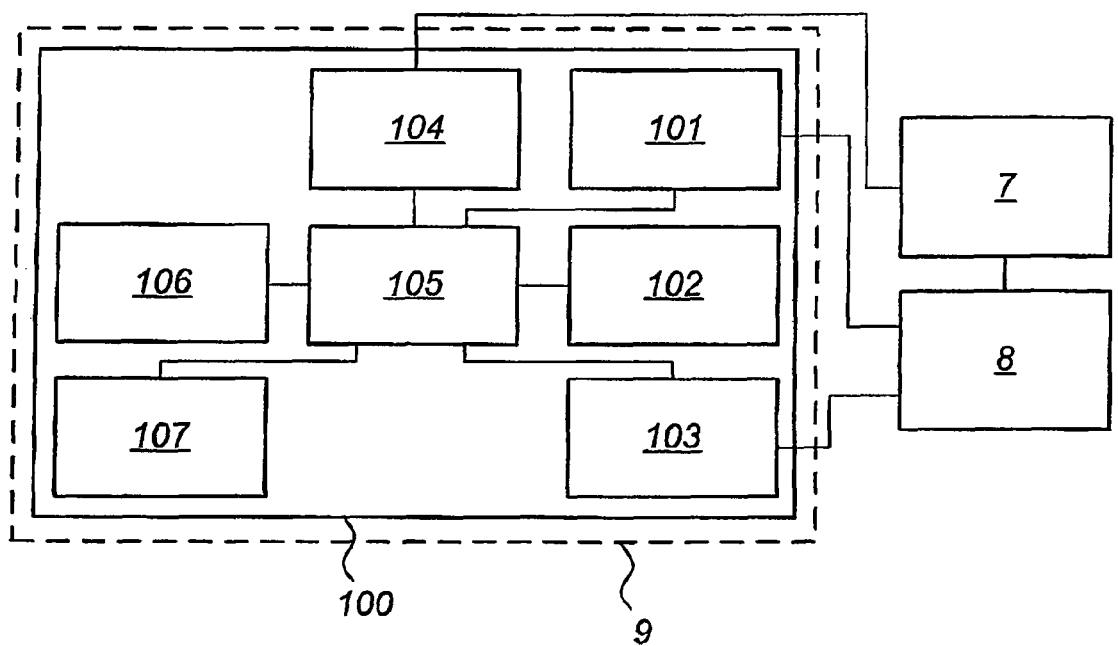
FIG. 3 is a schematic block diagram of a processing unit, which may be used in the system of FIG. 1.

Referring to FIG. 3, the process monitoring system may be implemented with a computer program product 100, which may be provided in the processing unit 9.

In a general sense, the computer program product 100 may comprise an input module 101 for receiving values representative of a current measured by the current meter 8. The values received by the input modules may optionally be synchronized with the pattern on the patterning roll 2.

Furthermore, the computer program product may comprise a processing module 105 for comparing the values representing the current with reference values, and an output module 106 for presenting a result of the comparison to a user. The reference values may be provided as indicated above when describing the process monitoring method.

Hence, the computer program product may comprise a reference calculation module 102, arranged to estimate/calculate a reference current trace based on a predetermined pattern, as indicated with respect to FIG. 2.

Furthermore, the computer program product may comprise a reference recording module 103, arranged to receive a value representative of a current measured by the current meter 8 during a reference run (i.e. a perfect or sufficiently good run), and to provide a reference current trace based thereon.

The reference calculation module 102 and/or the reference recording module 103 may also be arranged to receive, typically by user input, values indicating the charge required to pattern the substrate (per unit area), the speed at which the substrate is to be driven, and the total linear width of the substrate multiplied by the fraction being patterned at that time. Furthermore, the reference calculation module may be arranged to receive tolerance values, to integrate over position/time and to provide averages over a portion of the substrate web length.

The computer program product 100 may also comprise a control module 104 for providing a control signal to the current supply 7, e.g. for controlling the speed of the process or for stopping the process in case of a detected error.

The computer program product 100 may also comprise a storage module 107 for storing reference data provided by the reference calculation module 102 and/or the reference recording module 103, and/or for storing measure data.

In order to accurately predict the current that is to flow through the substrate, it may be advantageous if the substrate web is well defined, i.e. that its properties are well known. In some cases, there may be deviations in the material, e.g. due to tolerances. This may be compensated for by e.g. measuring the resistivity of the material prior to patterning. Such a measurement may e.g. be performed galvanically, using electrodes, capacitively or by measuring color or intensity of the material surface(s).

According to another embodiment, it is possible to apply the above outlined principles to a patterning process, wherein a portion, e.g. corresponding to the desired pattern, of the substrate or substrate surface is removed by e.g. evaporation or combustion. This may be achieved by driving a current through the electrodes 2, 3, which is large enough to achieve such evaporation or combustion. Such a current may be monitored as described herein. In such an embodiment, there is no need for electrolyte.

According to another alternative there is provided a method for monitoring a substrate patterning process, wherein at least two electrodes are used to apply a voltage to the substrate to provide a predetermined current causing a reaction in a portion of the substrate. This aspect comprises recording the voltage as a function of time and/or as a function of a position of the substrate or a patterning mask. Such a process is operable provided that the current reaches a material-specific threshold value, also considering the processing speed and material area/volume that is to be patterned.

This alternative may be more complicated, as it requires more detailed knowledge of the material area/volume that is to be patterned.

Other than what is mentioned above, the recording and related equipment may be performed and embodied as described above with reference to the recording of the current.

It is recognized that the process of the present disclosure may be used with any of the patterning techniques illustrated in US2004/0188656 A1.

The invention claimed is:

1. A method for monitoring a substrate patterning process, the method comprising:
   providing a substrate that includes an electrically conducting polymer;
   bringing an electrolyte into contact with the substrate;
   using at least two electrodes to apply a voltage to the substrate to cause an electronically driven electrochemical reduction or an oxidation reaction in an interface between the electrolyte and the substrate
   recording a current driven by said voltage as a function of time and/or as a function of a position of the substrate or a patterning mask during the patterning process.

2. The method as claimed in claim 1, further comprising comparing the recorded current, or a signal representative thereof, to an estimated current value or to a reference value.

3. The method as claimed in claim 2, further comprising providing an output signal based on said comparison.

4. The method as claimed in claim 3, wherein the output signal is used to provide a feedback for controlling the substrate patterning process.

5. The method as claimed in claim 1, further comprising storing the recorded current in a memory.

6. The method as claimed in claim 1, wherein the patterning process comprises transferring a pattern from a patterning roll onto the substrate.

7. The method as claimed in claim 1, wherein the patterning process comprises a printing step.

8. The method as claimed in claim 1, wherein the patterning process comprises providing the pattern by one of a plotter, a pen, screen printing, relief printing, planographic printing, lithography, and intaglio printing.

9. A method for monitoring a substrate patterning process, the method comprising:
   providing a substrate that includes an electrically conducting polymer;
   bringing an electrolyte into contact with the substrate;
   using at least two electrodes to apply a voltage to the substrate to provide a predetermined current causing an electronically driven electrochemical reduction or an oxidation reaction in an interface between the electrolyte and a portion of the substrate; and
   recording the voltage as a function of time and/or as a function of a position of the substrate or a patterning mask during the patterning process.

10. The method as claimed in claim 1, wherein each of said electrochemical reduction and said oxidation reaction is an electrical passivation of the substrate.

* * * * *

UNITED STATES PATENT AND TRADEMARK OFFICE
CERTIFICATE OF CORRECTION

PATENT NO. : 8,114,267 B2  
APPLICATION NO. : 11/976633  
DATED : February 14, 2012  
INVENTOR(S) : Staffan Nordlinder et al.

Page 1 of 1

It is certified that error appears in the above-identified patent and that said Letters Patent is hereby corrected as shown below:

On the Title page, item [30] should read:

(30) Foreign Application Priority Data

Oct. 27, 2006 (EP) ........................06123108.0

Signed and Sealed this  
Thirty-first Day of July, 2012

David J. Kappos  
*Director of the United States Patent and Trademark Office*